United States Patent [19]

Gargiulo

[11] Patent Number: 5,529,514
[45] Date of Patent: Jun. 25, 1996

[54] SCISSOR PIN RETENTION LEGS

[75] Inventor: Christopher T. Gargiulo, Winston-Salem, N.C.

[73] Assignee: The Whitaker Corporation, Wilmington, Del.

[21] Appl. No.: 306,739

[22] Filed: Sep. 15, 1994

[51] Int. Cl.$^6$ ................................ H01R 13/73
[52] U.S. Cl. ................................ 439/567
[58] Field of Search ................... 439/567, 571, 439/572

[56] References Cited

U.S. PATENT DOCUMENTS

| | | | |
|---|---|---|---|
| 4,435,031 | 3/1984 | Black et al. | 439/567 |
| 4,824,398 | 4/1989 | Taylor | 439/567 |
| 5,085,589 | 2/1992 | Kan | 439/92 |
| 5,104,339 | 4/1992 | Verhoeven | 439/567 |
| 5,145,407 | 9/1992 | Obata et al. | 439/567 |
| 5,241,451 | 8/1993 | Walburn et al. | 439/567 |
| 5,244,413 | 9/1993 | Clark | 439/567 |
| 5,244,414 | 9/1993 | Peloza | 439/567 |
| 5,257,948 | 11/1993 | Peterson | 439/571 |
| 5,334,049 | 8/1994 | Kachlic et al. | 439/567 |

*Primary Examiner*—Gary F. Paumen
*Attorney, Agent, or Firm*—Bruce J. Wolstoncroft; Mary K. Van Atten

[57] ABSTRACT

A component, for example, a pin header (2), is provided with latches (16) for insertion through holes (20) in a substrate (14) to secure the component (2) to the substrate (14). The latches (16) are formed integrally with the component (2) which is made of a stiffly resilient plastics material. Each latch (16) has a pair of latching legs (18) each including a flexing member (22) connected to a mounting surface (10) of the housing (6) and a barb (24) presenting a lip (26) which is substantially parallel with the mounting surface (10). As each latch (16) is inserted through the hole (20) in the substrate (14), the barbs (24) are cammed into crossed relationship. When the lips (20) have cleared the lower surface (40) of the substrate (14) the latching legs (18) resile so that the lips (26) snap into engagement beneath the lower surface (40) of the substrate (14). The component (2) is thereby fixedly secured to the substrate (14) with the mounting surface of the component (2) flush against the upper surface (38) of the substrate (14).

20 Claims, 5 Drawing Sheets

SCISSOR PIN RETENTION LEGS

BACKGROUND OF THE INVENTION

This invention relates to the secure latching of a component to a substrate and particularly, but not exclusively, concerns the secure latching of an electrical connector, for example, a pin header, to a substrate. Especially where solder tails projecting from a component are to be soldered to conductors on the substrate, the component should be immovably fixed to the substrate so that cracking of the solder joints and backing out of the solder tails are avoided.

U.S. Pat. Nos. 5,085,589, 5,104,339 and 5,145,407 disclose metal latches which are secured to the housing of a pin header connector, or the like, and which are configured to lock into a hole in a substrate.

There is disclosed in U.S. Pat. No. 5,085,589, a latch having a pair of latching legs each having a barb presenting a lip which latches beneath the underside of a substrate in parallel relationship therewith. Since the latching legs are coplanar with each other, the length of the lips is necessarily restricted in relation to the diameter of the hole in the substrate, because the flexure of the latching legs, as they are inserted into the hole, is restricted by abutment between the latching legs. In order to stabilize the connector on the substrate, a third latching leg may be provided in offset relationship with the pair of latching legs and having a detent which is engageable beneath the substrate. There is also disclosed, a latch having several latching legs distributed in circular array and each having an inclined cam surface which engages against the bottom corner of the hole.

U.S. Pat. No. 5,104,339 discloses a latch made of wire and having a pair of latching legs which are deformed into crossed relationship by insertion through a restricted passage in connector housing, by means of an arm of a machine, for example, a robot. The passage is aligned with a hole in a substrate and the machine arm forces the crossed latching legs through the hole, whereafter the latching legs resile so that inclined shoulders on the latching legs engage against the bottom corner of the hole in the substrate.

There is disclosed in U.S. Pat. No. 5,145,407 a latch having a pair of legs which are offset from each other so that they cross as they are inserted through a hole in a substrate so that bevels on the legs engage against the side of the hole.

SUMMARY OF THE INVENTION

An object of the present invention is to provide a latch which may be formed integrally with an insulating housing of a component and which is capable of holding the housing in secure fixed relationship with a substrate.

According to the invention, a latch for securing a component to a substrate having a hole therethrough, comprises a pair of latching legs for insertion through the hole in an insertion direction. Each latching leg has a stiffly resilient flexing member connected to a mounting surface of the component and a barb connected to the flexing member. The barb has a lip which is substantially parallel to the mounting surface and is spaced therefrom. The barbs of the latching legs have outer barb surfaces converging in the insertion direction and the flexing members are spaced from each other in two orthogonal directions. As the mounting legs are inserted through the hole from a top surface of the substrate, the barbs are cammed into crossed relationship by engagement of the converging barb surfaces with respective sides of the hole, against the resilient action of the flexing members, until the lips have passed through the hole and the mounting surface engages the top surface of the substrate. The flexing members then resile so that the lips snap into overlying engagement with the bottom side of the substrate.

The component may be made of stiffly resilient material, for example, a crystalline nylon polymer or a polybutylene terepthalate polyester, whereby the latch can be formed integrally with the component. Since the legs cross each other as the latch is inserted into the hole, the lips may be of relatively great length, although the length of the lips should not exceed one fifth of the diameter of the hole in the substrate. Preferably, in order to allow of sufficient rotational movement of the legs as they are inserted through the hole, a rectilinear inner surface of each flexing member is angled by about 80° with respect to the mounting surface of the component. Each latching leg may have an angle of rotation of between 14° and 18° in dependence upon the length of the flexing member of the leg.

According to a particular application of the invention, the component is a pin header or the like, containing terminals having solder tails projecting from the mounting surface for insertion through respective contact tail receiving holes in the substrate to be soldered to conductors on the bottom surface of the substrate. The relatively great length of the lips which engage the bottom surface of the substrate and the stiffly resilient nature of the latching legs ensure that the housing is immovable with respect to the substrate, so that cracking of the soldered joints and backing out of the contact tails is avoided.

Preferred embodiments of the invention will now be described by way of example with reference to the accompanying drawings.

DETAILED DESCRIPTION OF THE PREFERRED EMBODIMENTS

Figure 1:
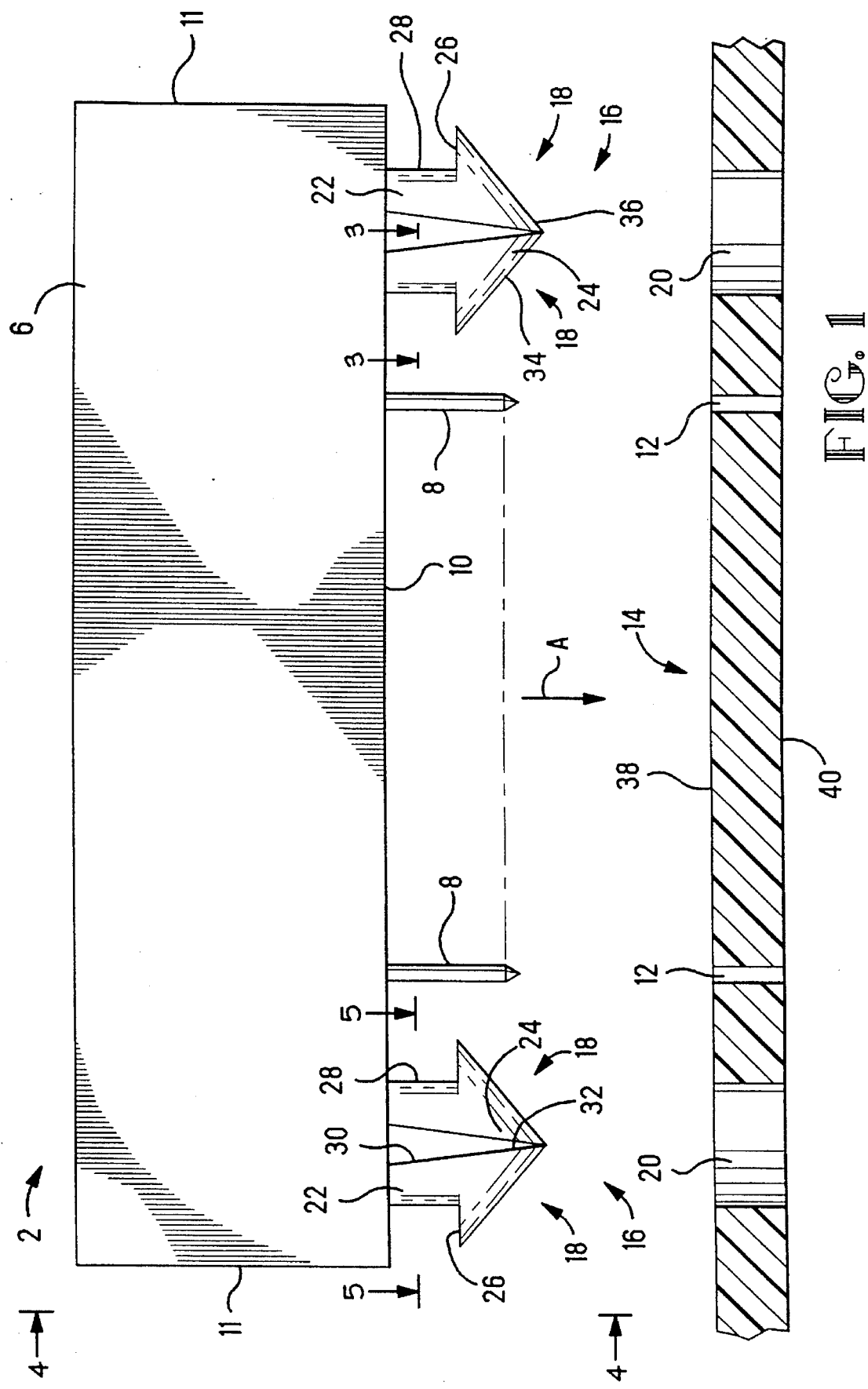
FIG. 1 is side view, which is not drawn to scale, of a pin header positioned for assembly to a substrate, in the form of printed circuit board, which is shown in section, the pin header having latches according to the invention, for insertion in holes in the board to latch the pin header thereto.
Figure 2:
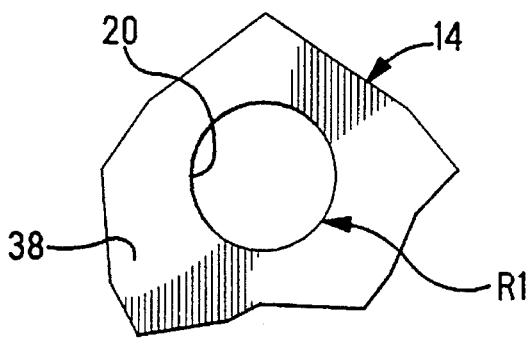
FIG. 2 is a fragmentary plan view of the circuit board showing one of the holes.

One embodiment will now be described in outline with reference to FIGS. 1 to 8. As shown in FIG. 1 a pin header 2, comprises an elongate insulating housing 6 having therein at least one row of pin terminals with solder tails 8 projecting from a bottom mounting surface 10 of the housing 6 each for insertion in a respective first through hole 12 in a substrate in the form of a printed circuit board 14. Only a few of the holes 12 are shown. There also projects from the mounting surface 10 proximate to each end 11 of the housing 6, a respective board latch 16 having a pair of latching legs 18 for insertion through a respective second through hole 20 in the board 14 to secure the pin header 2 thereto. As will be apparent from FIGS. 4 and 5, the latch arms 18 of each latch 16 are spaced from each other transversely of the length of the housing 6.

Figure 3:
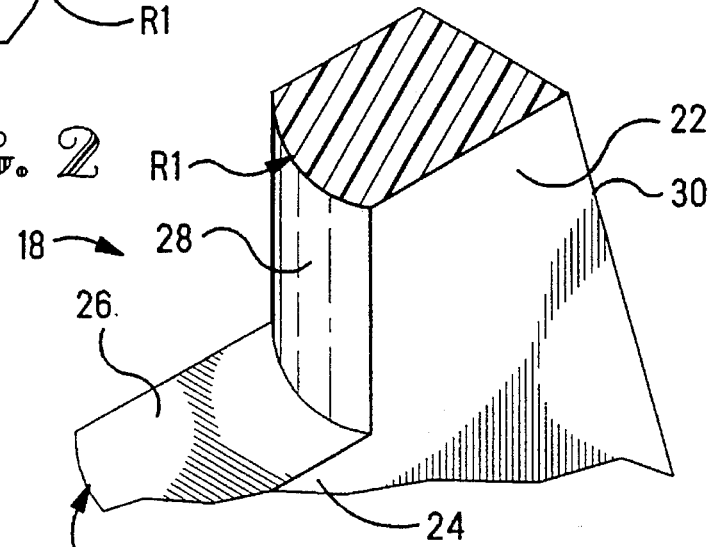
FIG. 3 is a fragmentary isometric view shown partly in section on the lines 3—3 of FIG. 1.
Figure 4:
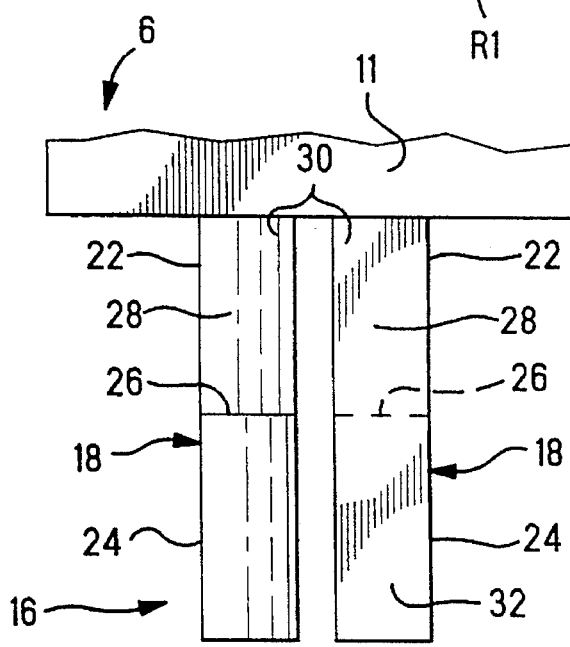
FIG. 4 is an enlarged fragmentary view taken in the direction of the arrow 4 in FIG. 1.
Figure 5:
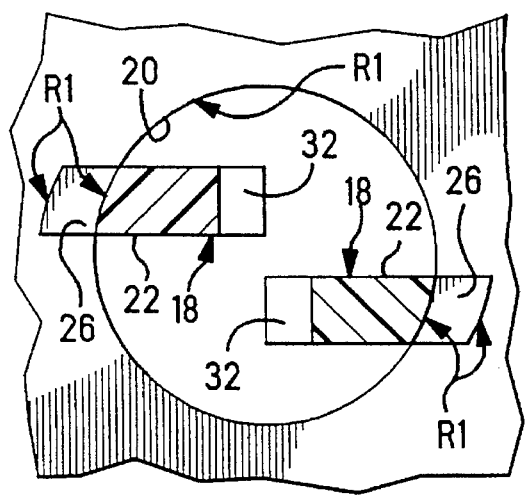
FIG. 5 is an enlarged plan view shown partly in section, on the lines 5—5 of FIG. 1.

The latching legs 18 may be molded with the housing 6 and to this end, the housing 6 is made from a stiffly resilient plastics material which is discussed in more detail below. Each latching leg 18 comprises a flexible member in the form of a shank 22 which is connected at one end to the housing 6 in spaced relationship, longitudinally of the housing 6 with respect to the other latch arm of the latch 16. The shanks 22 are accordingly spaced from each other in two orthogonal directions, one longitudinally of the housing 6 and the other transversely thereof as will be apparent from FIGS. 1, 4 and 5. The other end of each shank 22 is connected to a barb 24 having a latching lip 26 facing the mounting surface 10 in substantially parallel relationship therewith. The lip 26 extends at right angles to the outer face 28 of the shank 22, which face, in turn extends at right angles to the mounting surface 10. The opposite continuous face 30 and 32 of the shank 22 and the barb 24, respectively, are inclined at an acute angle with respect to the mounting surface 10 and define an acute angle with the outer surface 34 of the barb 24 at the point 36 of the barb 24. The latching legs 18 of each latch 16 are oppositely oriented with their lips 26 oppositely directed and being offset transversely of the length of the housing 6 but lying in the same horizontal plan. As shown in FIGS. 3 and 5, the outer face 28 of each shank 22 has the same radius R1 as the corresponding hole 20. The outer face 34 of each barb 24 may be similarly radiused.

Figure 6:
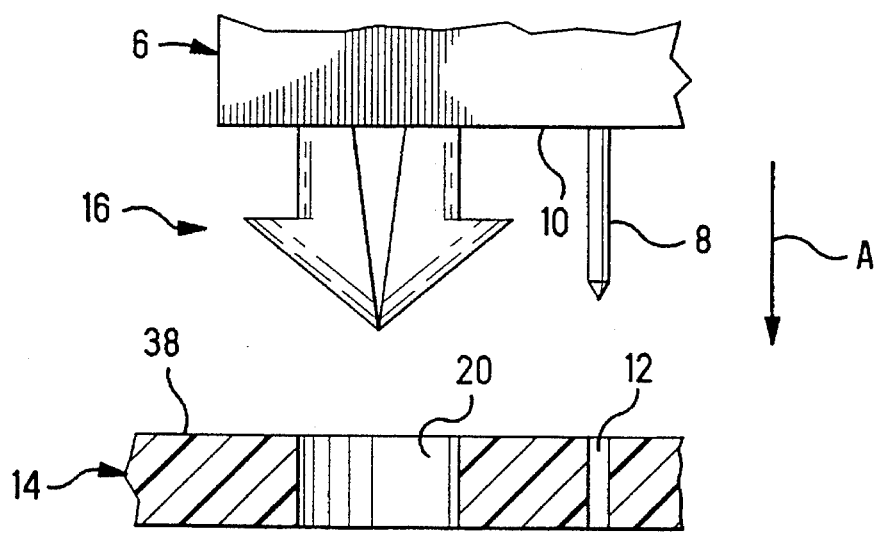
FIGS. 6 to 8 are fragmentary side views illustrating consecutive steps in the assembly of the pin header to the circuit board.
Figure 7:
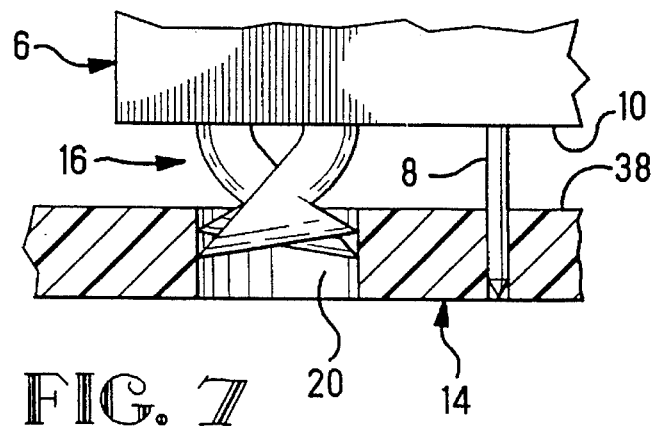
Figure 8:
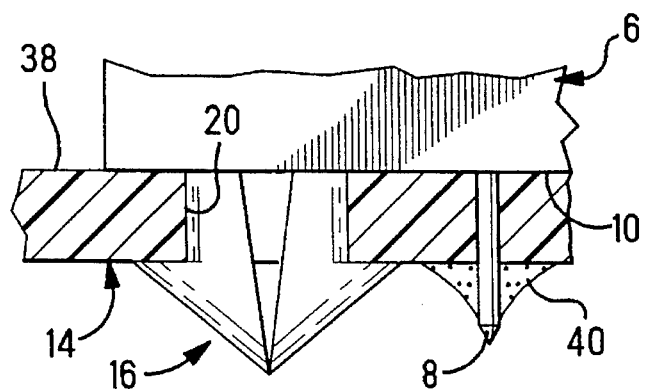

In order to assembly the header 2 to the board 14, the header 2 is advanced towards the board 14 in the direction of the arrow A in FIGS. 1 and 6 to insert each latch 16 through a respective hole 20 and each solder tail 8 through a respective hole 12 so that the mounting surface 10 of the housing 6 lies flush against the upper surface 38 of the board 14, as shown in FIG. 8. As each latch 16 is inserted through its respective hole 20, the outer faces 34 of the barbs 24 of the latching legs engage opposite sides of the hole 20 so that the latching legs 18 are cammed resiliently towards each other by virtue of the resilient and rotary deformation of the shanks 22 the latch 16 towards each other. Since the shanks are offset from one another transversely of the length of the housing 6, the barbs 24 move, without interference therebetween, into crossed relationship as shown in FIG. 7, so that during the insertion of each latch 16, the tips 25 of the lips 26 ride down along the opposite sides of the hole 20. Upon the mounting surface 10 of the housing 6 engaging the upper surface 38 of the board 14, as shown in FIG. 8, the lips 26 have passed through the hole 20 just beyond the lower surface 40 of the board 14, whereby the shanks 22 resile so that the lips 26 snap back so as to underlie the surface 40 of the board 15 and are seated thereagainst. The relatively great length of the lips 26 ensures that the mounting surface 10 of the header 2 is held down securely against the board 14. The solder tails 8 are then soldered to conductors (not shown) on the lower surface 40 of the board 14, by means, for example, of a wave soldering bath. Since the header 2 is secured tightly to the board 14 by virtue of the engagement of the lips 26 against the lower surface 40 of the board 14, relative movement between the header 2 and the board 14 is prevented so that the solder tails 8 cannot back up from their holes 12 during the soldering operation and cracking of the finished soldered joints is avoided. The rotary movement of the latching legs 18 as they resile, ensures that the latching lips 26 engage firmly against the lower surface 40 of the board 14.

In order to ensure that the lips 26 remain securely in engagement with the surface 40 of the board 14, the material of the latches 16 must have a sufficiently high heat deflection temperature (HDT) to allow the latching legs 18 to maintain their original shape and strength under the soldering heat and a high enough flexural modulus to enable full snap back of the legs 18 when the latch 16 has been inserted through the hole 20. The material of the housing 6, and thus of the latches 16, may, to these ends, be a crystalline polymer or a polybutylene terepthalate (PBT) polyester. A crystalline nylon polymer, STANYL, a nylon 46, made by DSM Engineering Plastics has a very high heat deflection temperature because it is a crystalline polymer. STANYL has very good strength properties and thus an appropriate amount of stiffness and because it is a nylon and absorbs moisture, STANYL has the necessary flexibility and enough resilience to allow the latching legs 16 to snap back with little permanent set. A PBT polyester, VALOX, made by GE Plastics, a division of General Electric, has similar but slightly lower heat deflection temperature properties, but has good flexibility and a high enough flexural modulus to provide sufficient snap back.

The length of the lip 26 should not exceed ⅕th of the diameter of the hole 20 if the lips of the latch 16 are to pass through the hole 20.

In order to allow sufficient deflection the legs 18, the angle defined between the mounting surface 10 and the inner face 30 of each shank 22 is preferably about 80°, the angle of rotation of each leg 18 being between about 14° and 20°, depending upon the length of the shank 22 of the leg 18.

Figure 9:
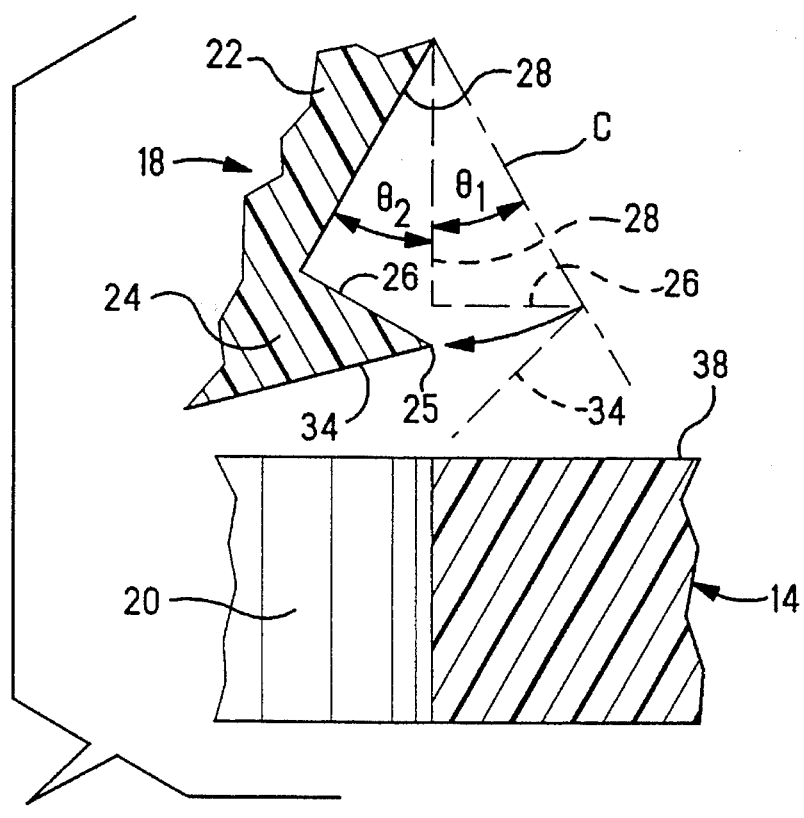
FIGS. 9 and 10 are enlarged fragmentary sectional views illustrating examples of the relative dimensioning of a latching leg of latches according to the invention.
Figure 10:
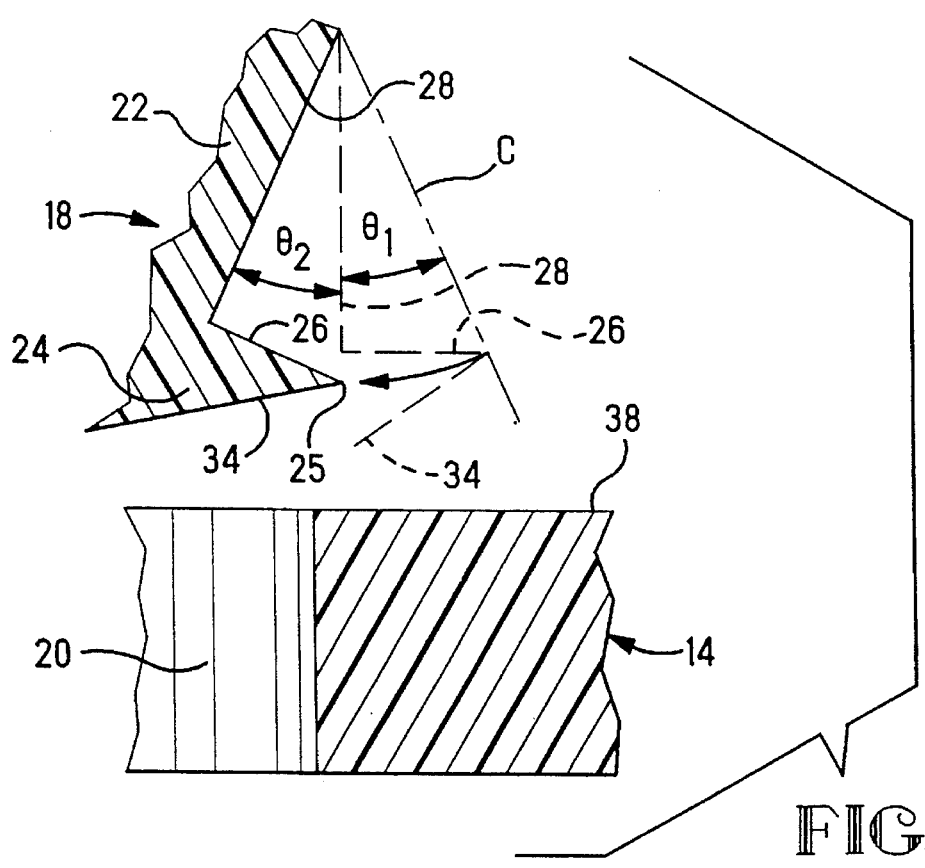
Figure 11:
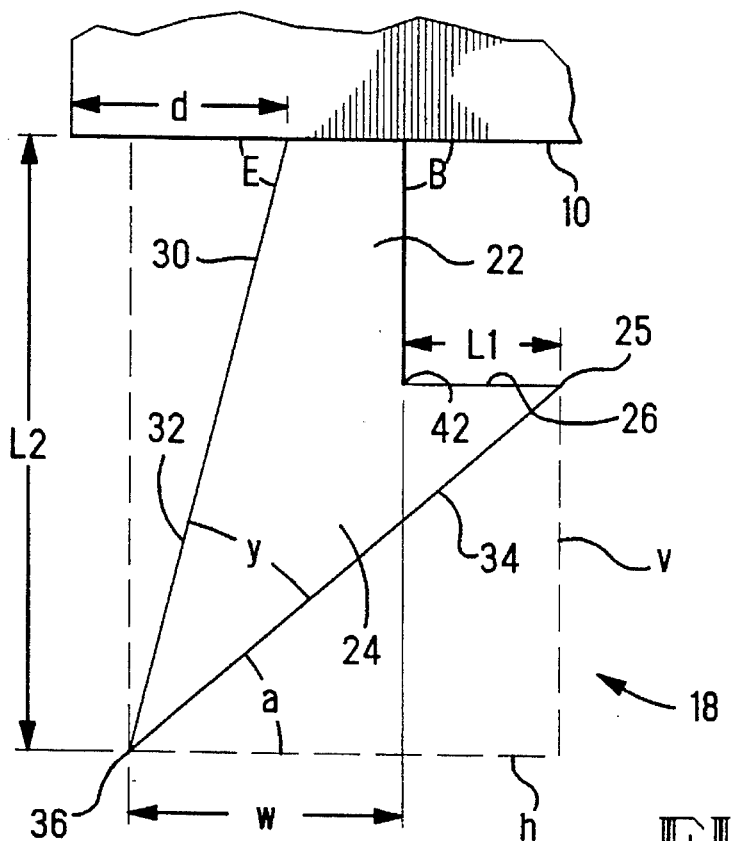
FIGS. 11 and 12 are enlarged side views, corresponding to FIGS. 9 and 10 respectively, illustrating further relative dimension of the latching legs.
Figure 12:
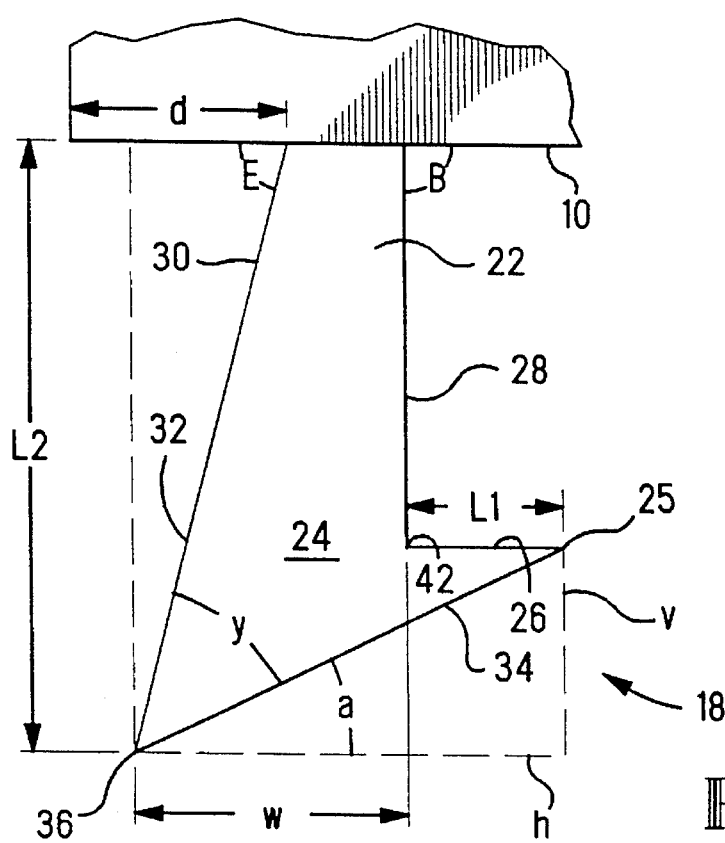

Reference will now be made to FIGS. 9 to 12 which show two embodiments of the latching leg 18, one embodiment being shown in FIGS. 9 and 11 and the other in FIGS. 10 and 12. As shown in FIGS. 9 and 10, the angle of rotation $\theta_1$ of the leg 18 is equal to the angle $\theta_1$ defined between a chain-dot imaginary line C joining the junction of the outer face 28 of the shank 22 with the mounting surface 10, and the tip 25 of the lip 26. This means that the legs 18 of the latch 16 can rotate towards each other to the extent that a tip 25 of each lip 26 is aligned with the hole 20. The outer face 28 of the shank 22 extends at a right angle B (FIGS. 11 and 12) to the mounting face 10 of the housing 6. In FIG. 9 the angles $\theta_1$ and $\theta_2$ are about 20°, the length of the shank 22 being about 2.8 times the length L1 of the lip 26. In FIG. 10 the angles $\theta_1$ and $\theta_2$ are about 14°, the length of the shank 22 being about four times that the length L1. The length L1 in FIG. 11 is equal to the length L1 in FIG. 12, being about ⅕th of the diameter of the hole 20. In both embodiments, the angle E defined between the mounting surface 10 and the inner face 30 of the shank 22 is about 80° which allows of sufficient rotation of the legs 18. So in both embodiments the combined length of the inner faces 30 and 32 is the same, being about 6.8 times the length for L1. In FIG. 11, the angle a defined between the outer face 34 of the barb 24 and an imaginary horizontal line h is about 48°, the same angle in FIG. 12 being about 37°. In FIG. 11, an imaginary vertical line V between the tip 25 of the lip 26 and the imaginary horizontal line h is about four times the length L1 of the lip 26, the line V in FIG. 12 being about 2.7 times the length L1 of the lip 26. The angle y of the point 36 of the barb 24 is greater as the length of the shank 22 is increased, being about 32° in FIG. 11 and about 43° in FIG. 12. In either case, however, the overall length L2 of the leg 18 is the same. The width w of the leg 18 between the inner end 42 of the lip 26 and the tip 36 of the barb 24 is about 2.4 times the length L1 both embodiments. Also, in both embodiments, the latching legs 18 are spaced by the same distance d lengthwise of the housing 6 which is about 1.2 times the length L1.

As will appear from the above description, in both embodiments, the angles E and b, the lengths L1 and L2, the width w and the distance d are constant.

The latches described above, could, of course, be provided on connectors other than pin header connectors or indeed on any other suitable plastics moldings, to secure them to a substrate.

What is claimed is:

1. A latch for securing a component to a substrate having a hole therethrough, the latch comprising a pair of latching legs for insertion through said hole in an insertion direction, each latching leg having a stiffly resilient flexing member connected to a mounting surface of the component and a barb connected to the flexing member, the barb having a lip which is substantially parallel to the mounting surface and is spaced therefrom, the barbs of the latching legs having outer barb surfaces converging in the insertion direction and the flexing members being spaced and offset from each other in two orthogonal directions; whereby as the mounting legs are inserted through said hole from upper surface of the substrate, the barbs are cammed into crossed relationship by engagement of said converging barb surfaces with respective sides of the hole, against the resilient action of the flexing members, until the lips have passed through the hole and the mounting surface engages said upper surface of the substrate, so that the flexing members resile to cause the lips to snap into engagement with the lower surface of the substrate.

2. A latch as claimed in claim 1, wherein the component and the latching legs are molded integrally with each other from a stiffly resilient plastics material.

3. A latch as claimed in claim 1, wherein a rectilinear inner surface of each flexing member is angled by about 80° with respect to the mounting surface.

4. A latch as claimed in claim 1, wherein the length of each lip is no greater than ⅕th of the diameter of the hole in the substrate.

5. A latch as claimed in claim 1, wherein each latching leg has an angle of rotation between 14° and 18° with respect to the mounting surface, in dependence upon the length of the flexing member of the latching leg.

6. A latch as claimed in claim 1, wherein the length of each flexing member is between about 2.8 and 4 times the length of the lip.

7. A latch as claimed in claim 1, wherein the outer face of each flexing member extends at right angles to the lip and to the mounting surface.

8. A latch as claimed in claim 1, wherein the combined length of the inner faces of the flexing member and the barb of each latching leg is about 2.8 times the length of the lip.

9. A latch as claimed in claim 1, wherein each barb terminates in a points, the point of the barbs being aligned with each other.

10. An electrical connector comprising an insulating housing molded from a stiffly resilient material and having a mounting surface, a plurality of electrical terminals in the housing each having a solder tail depending from the mounting surface for insertion through a respective first through hole in a substrate from a first surface thereof, and a pair of latching legs formed integrally with the housing and depending from the mounting surface for insertion through a second hole in the substrate from said first side thereof, each latching leg having a lip projecting outwardly therefrom substantially parallel to the mounting surface and being spaced from the mounting surface, each latching leg having an inclined outer surface extending from the lip in a direction away from said mounting surface, for guiding the latching leg into said second hole, the latching legs being offset from each other in each of two orthogonal directions; whereby when the latching legs are inserted through the second hole, they are cammed towards each other into crossed relationship, by respective sides of the second hole, the latching legs resiling when the mounting surface engages the substrate, the lips have passed through the second hole and the soldered tails have passed through the first holes, so that each lip snaps into engagement with a second surface of the substrate opposite to said first surface.

11. A connector as claimed in claim 10, wherein each latching leg has an inclined inner surface which is opposite to the inclined outer guiding surface of the leg, said inner and outer inclined surfaces converging in a direction away from the mounting surface of the housing, each latching leg having a rectilinear further outer surface extending from the lip of the latching leg to the mounting surface of the housing, at right angles to the mounting surface and at right angles to the lip, said inner inclined surface of each latching leg defining an angle of about 80° with respect to the mounting surface of the housing.

12. A connector as claimed in claim 10, wherein the legs are rotatable towards each other each through an angle of between about 14° and 18°.

13. A connector as claimed in claim 11, wherein said rectilinear outer surface of each latching leg has a length of between 2.8 times and 4 times the length that the lip extends from the latching leg.

14. A connector as claimed in claim 10, wherein the material of the housing and thus of the latching legs has a high deflection temperature and a high flexure modulus.

15. In combination, a component molded from a stiffly resilient plastics material, and a substrate having a through circular hole opening into first and second opposite surfaces of the substrate, the component having a flat mounting surface for face to face engagement with the first surface of the substrate, and a latch for latching engagement in the through hole, to hold the mounting surface in engagement with the first surface of the substrate, the latch comprising a pair of latching legs molded integrally with the component and extending from said mounting surface and away therefrom, in offset relationship in two orthogonal directions in the plane of the mounting surface, each latching leg comprising a lip spaced from the mounting surface by the thickness of the substrate and extending substantially parallel to the mounting surface, the lips projecting outwardly of the latching legs in opposite directions, an inclined outer guide surface extending from the outer end of each lip and these guiding surfaces extending towards each other in a direction away from the mounting surface, each lip projecting from the respective latching leg by a distance which is no greater than ⅕th of the diameter of the hole, the latch being insertable through the hole in the substrate from the first surface of the substrate, to cause respective sides of the hole to engage said guide surfaces of the latching legs thereby resiliently to cam the latching legs into crossed relationship, the lips then to clear the second surface of the substrate and the latching legs finally to resile so that the lips snap into underlying relationship with the second surface of the substrate as the mounting surface of the component engages the first side of the substrate.

16. The combination claimed in claim 15, wherein the latching legs are rotatable towards each other, each about a flexing member extending from the mounting surface of the latching leg to the lip of the latching leg.

17. The combination claimed in claim 16, wherein each flexing member tapers towards the mounting surface of the component.

18. The combination claimed in claim 16, wherein the outer surface of each flexing member is arcuate and is of the same radius as the hole in the substrate.

19. The combination claimed in claim 15, wherein the material of the housing and the latch has a high deflection temperature and a high flexure modulus.

20. The combination claimed in claim 19, wherein said material is selected from the group consisting of crystalline nylon polymers and polybutylene terephtalate polyesters.

* * * * *